(12) United States Patent
Tani et al.

(10) Patent No.: US 7,321,245 B2
(45) Date of Patent: Jan. 22, 2008

(54) PIPELINED AD CONVERTER CAPABLE OF SWITCHING CURRENT DRIVING CAPABILITIES

(75) Inventors: Kuniyuki Tani, Gifu (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 156 days.

(21) Appl. No.: 10/808,575

(22) Filed: Mar. 25, 2004

(65) Prior Publication Data
US 2004/0189374 A1 Sep. 30, 2004

(30) Foreign Application Priority Data
Mar. 26, 2003 (JP) ............................. 2003-086497
Mar. 4, 2004 (JP) ............................. 2004-060507

(51) Int. Cl.
*H03K 3/00* (2006.01)
(52) U.S. Cl. .................. 327/109; 327/108; 327/538; 327/543; 323/316
(58) Field of Classification Search ............... 327/538, 327/540–543, 561, 108–112, 276, 277, 280, 327/281, 287, 288, 530; 341/161, 162; 323/313, 323/316, 315
See application file for complete search history.

(56) References Cited

U.S. PATENT DOCUMENTS

| | | | | |
|---|---|---|---|---|
| 5,159,516 A | * | 10/1992 | Fujihira | 361/18 |
| 5,254,883 A | * | 10/1993 | Horowitz et al. | 326/30 |
| 5,422,588 A | * | 6/1995 | Wynne | 327/437 |
| 5,506,541 A | * | 4/1996 | Herndon | 327/541 |
| 5,650,672 A | * | 7/1997 | Curd | 307/130 |
| 5,670,908 A | * | 9/1997 | Kim et al. | 327/543 |
| 5,796,295 A | * | 8/1998 | Sharpe-Geisler | 327/541 |
| 5,898,618 A | * | 4/1999 | Lakkapragada et al. | 365/185.22 |

(Continued)

FOREIGN PATENT DOCUMENTS

| | | |
|---|---|---|
| JP | 1-137629 | 9/1989 |
| JP | 5-17712 | 1/1993 |
| JP | 9-69776 | 3/1997 |
| JP | 11-085113 | 3/1999 |

OTHER PUBLICATIONS

Chinese Office Action for Application No. 20040031790.6; Issuing Date: Nov. 11, 2005; Sanyo Electric Co., Ltd.

(Continued)

*Primary Examiner*—Tuan T. Lam
*Assistant Examiner*—William Hernandez
(74) *Attorney, Agent, or Firm*—McDermott Will & Emery LLP (57) ABSTRACT

A first bias voltage generating circuit which applies a bias voltage to an amplifier circuit of an AD converter has a driving unit and a control unit. The driving unit includes a first bias circuit and a second bias circuit as a plurality of bias circuits which are connected in parallel and have different current driving capabilities. The first bias circuit and the second bias circuit each include a CMOS transistor which is connected directly between a power supply potential and a ground potential, and a switching element which interrupts a feedthrough current. The drains of the CMOS transistors output the bias voltage. The control unit turns on both or either one of the first bias circuit and the second bias circuit, thereby controlling the current driving capability of the entire driving unit.

13 Claims, 8 Drawing Sheets

U.S. PATENT DOCUMENTS

| | | | | |
|---|---|---|---|---|
| 5,940,287 | A | * | 8/1999 | Brkovic .................... 363/127 |
| 6,028,546 | A | * | 2/2000 | Signell et al. ............. 341/161 |
| 6,163,178 | A | * | 12/2000 | Stark et al. ................ 327/108 |
| 6,163,184 | A | * | 12/2000 | Larsson ..................... 327/156 |
| 6,198,337 | B1 | * | 3/2001 | Matsuura ................... 327/525 |
| 6,211,661 | B1 | * | 4/2001 | Eckhardt ................... 323/316 |
| 6,243,278 | B1 | * | 6/2001 | Jacobs ....................... 363/127 |
| 6,548,995 | B1 | * | 4/2003 | Li ............................... 323/314 |
| 6,777,976 | B2 | * | 8/2004 | Kuge .......................... 326/30 |
| 6,819,164 | B1 | * | 11/2004 | Chen .......................... 327/540 |
| 6,850,099 | B2 | * | 2/2005 | Klehn et al. ................ 327/108 |
| 2002/0060603 | A1 | * | 5/2002 | Kawasumi .................. 327/543 |
| 2004/0164788 | A1 | * | 8/2004 | Devin ........................ 327/543 |
| 2006/0061395 | A1 | * | 3/2006 | Noto et al. ................. 327/108 |

OTHER PUBLICATIONS

Japanese Office Action issued on corresponding Japanese Patent Application No. JP 2004-060507, dated Dec. 5, 2006.

Japanese Office Action, with English Translation, issued in corresponding Japanese Patent Application No. 2004-060507, dated on Sep. 11, 2007.

* cited by examiner

PIPELINED AD CONVERTER CAPABLE OF SWITCHING CURRENT DRIVING CAPABILITIES

BACKGROUND OF THE INVENTION

1. Field of the Invention

The present invention relates to a bias voltage generating circuit and an amplifier circuit. In particular, the invention relates to a technology for controlling bias circuits.

2. Description of the Related Art

Recently, cellular phones have incorporated a variety of additional functions such as an image shooting function, an image reproducing function, a moving image shooting function, and a moving image reproducing function. Then, reduced power consumption is increasingly required of built-in amplifier circuits. In particular, one-chip LSIs containing analog-to-digital converters (hereinafter, referred to as an "AD converter") are becoming finer year by year, requiring a further reduction in power supply voltage. Multistage pipelined AD converters are known as AD conversion circuits of high conversion accuracy (for example, see Japanese Patent Laid-Open Publication No. Hei 9-69776, its entirety and FIG. 1). Moreover, AD converters contain operational amplifiers, and there have been known techniques for accelerating the rise of the output voltages of circuits that apply biases to the operational amplifiers (for example, see Japanese Utility Model Laid-Open Publication No. Hei 5-17712, its entirety and FIG. 1).

The amplifier circuits mentioned above usually keep applying the bias voltages irrespective of the types of their operations, thus consuming power more than necessary. Meanwhile, the bias voltages can be turned off for a relatively long time during a standby period in which no power is required, whereas capacitors or other components must be provided to reduce leakage during the off period. This has caused a problem of increased circuit area.

SUMMARY OF THE INVENTION

The present invention has been achieved in view of the foregoing circumstances. It is thus an object of the present invention to reduce the power consumption of a circuit which applies a bias voltage.

One of the aspects of the present invention is a bias voltage generating circuit. This circuit comprises a driving unit which generates a bias voltage to be applied to a predetermined load, and a control unit which switches a current driving capability of the driving unit according to a variation in an amount of current required for the load in a period for applying the bias voltage to the load.

The "predetermined load" is a circuit which makes periodic variations in the amount of current required, such as an AD converter and an amplifier included therein. The "period for applying the bias voltage" refers to, for example, one in which the predetermined load is to be operated, excluding a period when the application of the bias voltage is unnecessary. That is, the control unit changes the driving of current finely without lowering the current driving capability to zero. Consequently, in the operation period of the load, the power consumption can be controlled finely to a necessary and sufficient amount for the sake of overall power saving.

The driving unit may include a plurality of bias circuits which are connected in parallel and have different current driving capabilities. It may include a plurality of bias circuits which are connected in parallel and have the same current driving capability. These plurality of bias circuits may independently output different bias voltages, or may output the same bias voltage. The control unit may switch the current driving capability by controlling the number of circuits to operate out of the plurality of bias circuits. The plurality of bias circuits may output a first bias voltage having generally the same value as the power supply voltage and a second bias voltage having a different predetermined value from the power supply voltage, selectively.

The bias circuits may each include: a CMOS transistor composed of a PMOS transistor and an NMOS transistor which are connected in series between a power supply potential and a ground potential and have a common drain connected to their respective gates, the drain outputting the bias voltage; a switching element which interrupts a feedthrough current occurring from the CMOS transistor; and a switching element which controls output of the bias voltage from the CMOS transistor. The control unit may control the number of circuits to operate by sending control signals to the respective switching elements included in the plurality of bias circuits.

Another aspect of the present invention is an amplifier circuit. This circuit comprises: an amplifier unit which repeats an auto-zero operation and an amplification operation alternately; a driving unit which supplies the amplifier unit with a bias voltage; and a control unit which switches the current driving capability of the driving unit according to a variation in an amount of current required between the auto-zero operation and the amplification operation of the amplifier unit. For example, this amplifier circuit may be a multistage pipelined AD converter having a plurality of stages of conversion units which generate several bits of digital values of descending order from an input analog voltage, respectively. In this case, the control unit may control the current driving capability so as to drive the conversion unit at the initial stage, requiring the highest analog precision, with a relatively high current and drive the second and subsequent conversion units with a lower current.

The bias circuits may each include: a CMOS transistor composed of a PMOS transistor and an NMOS transistor which are connected in series between a power supply potential and a ground potential and have a common drain connected to their respective gates, the drain outputting the bias voltage; a switching element which interrupts a feedthrough current occurring from the CMOS transistor; and a switching element which controls output of the bias voltage from the CMOS transistor. The control unit may control the number of circuits to operate by sending control signals to the respective switching elements included in the plurality of bias circuits.

Even in this aspect, the driving current can be fine adjusted for a reduction in the power consumption of the amplifier circuit.

It is to be understood that any combinations of the foregoing components, and the components and expressions of the present invention having their methods, apparatuses, systems, and the like replaced mutually are also intended to constitute applicable aspects of the present invention.

DETAILED DESCRIPTION OF THE INVENTION

FIRST EMBODIMENT

Figure 1:
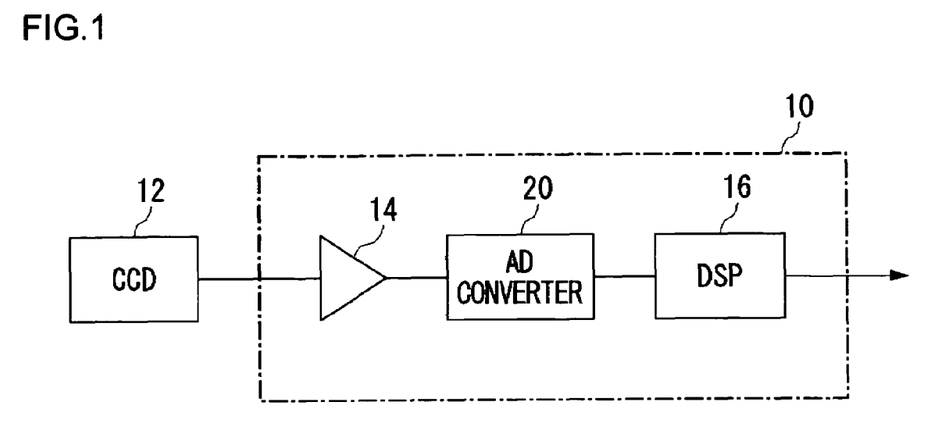
FIG. 1 is a diagram showing the basic configuration of an image processing circuit which includes, as one of its components, a bias voltage generating circuit according to a first embodiment of the present invention.

FIG. 1 shows the basic configuration of an image processing circuit which includes, as one of its components, a bias voltage generating circuit according to the present embodiment. An image sensor 12 such as CCD (Charge Coupled Device) and a CMOS sensor receives light from a subject, converts it into an electric signal, and inputs the resultant to a one-chip LSI (Large Scale Integration) 10. The one-chip LSI 10 contains an AGC (Auto Gain Control) 14, an AD converter 20, and a DSP (Digital Signal Processor) 16. The AGC 14 amplifies the electric signal received from the image sensor 12. The AD converter 20 converts the amplified analog signal into a digital signal. The DSP 16 applies compression and/or other image processing to the converted digital signal. The components built in the one-chip LSI 10 are each powered by a predetermined voltage source.

The AD converter 20 contains bias voltage generating circuits which achieve a reduction in power consumption. The one-chip LSI 10 itself is reduced in total power consumption, and is particularly suitably mounted on mobile terminals such as a cellular phone of which power saving is demanded highly. These bias voltage generating circuits and the AD converter 20 containing the same are suitably implemented in the one-chip LSI 10 since they yield no increase in circuit area ascribable to increasing capacitances of capacitors.

Figure 2:
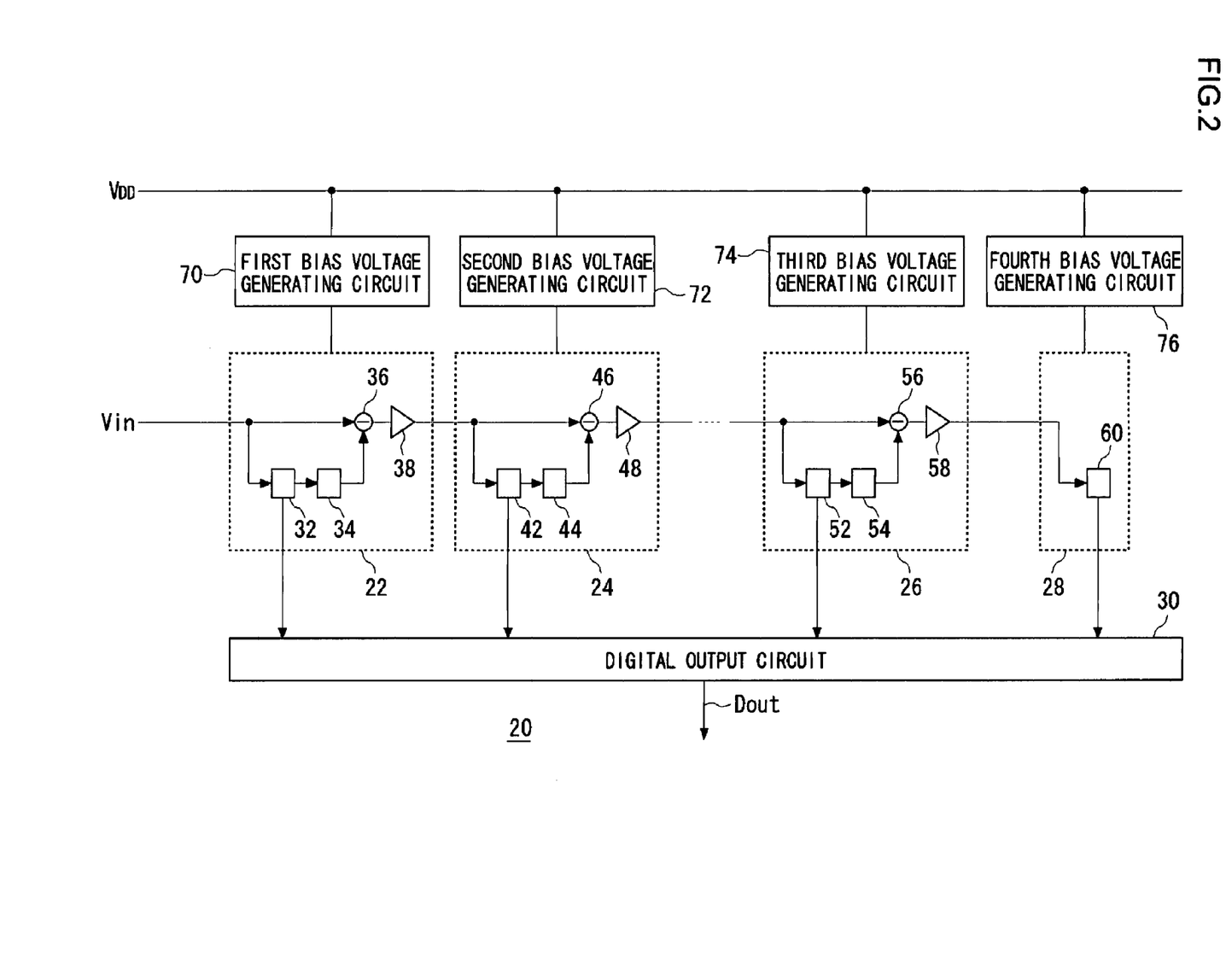
FIG. 2 is a diagram showing the configuration of an AD converter according to the first embodiment.

FIG. 2 shows the configuration of the AD converter 20 according to the first embodiment. The AD converter 20 performs 10-bit AD conversion by stepwise processing using n stages of conversion units, or a first conversion unit 22 through an nth conversion unit 28. The first conversion unit 22 at the initial stage processes four bits, and the subsequent stages the other bits. When n=4, the second to fourth stages are to process two bits each.

The first conversion unit 22 includes a first AD conversion circuit 32, a first DA conversion circuit 34, a first subtractor circuit 36, and a first amplifier circuit 38. The first AD conversion circuit 32 is a sub AD conversion circuit which converts the input analog signal into a predetermined number of upper bits of digital signal. Here, for example, four bits of digital value shall be output to the first DA conversion circuit 34 and the digital output circuit 30. The first DA conversion circuit 34 converts the digital value output from the first AD conversion circuit 32 into an analog signal. The first subtractor circuit 36 supplies the difference between the original input analog signal and the analog signal from the first DA conversion circuit 34 to the first amplifier circuit 38. The difference is amplified by the first amplifier circuit 38 and sent to a second conversion unit 24. The first amplifier circuit 38 is an amplifier of switched capacitor type, for example. The first subtractor circuit 36 and the first amplifier circuit 38 may be combined into a differential amplifier circuit.

The second conversion unit 24 includes a second AD conversion circuit 42, a second DA conversion circuit 44, a second subtractor circuit 46, and a second amplifier circuit 48. These components make operations similar to those of the first AD conversion circuit 32, the first DA conversion circuit 34, the first subtractor circuit 36, and the first amplifier circuit 38 in the first conversion unit 22, respectively. Note that the second AD conversion circuit 42 outputs two bits lower than the output bits of the first AD conversion circuit 32, for example.

An (n-1)th conversion unit 26 includes an (n-1)th AD conversion circuit 52, an (n-1)th DA conversion circuit 54, an (n-1)th subtractor circuit 56, and an (n-1)th amplifier circuit 58. Again, these components make operations similar to those of the first AD conversion circuit 32, the first DA conversion circuit 34, the first subtractor circuit 36, and the first amplifier circuit 38 in the first conversion unit 22, respectively. Note that the (n-1)th AD conversion circuit 52 outputs two bits lower than the output bits of the preceding stage. An nth conversion unit 28 includes an nth AD conversion circuit 60. The nth AD conversion circuit 60 outputs the lowest two bits. The digital output circuit 30 synthesizes the digital signals received from the first conversion unit 22, the second conversion unit 24, the (n-1)th conversion unit 26, and the nth conversion unit 28 to output a 10-bit digital signal.

Figure 3:
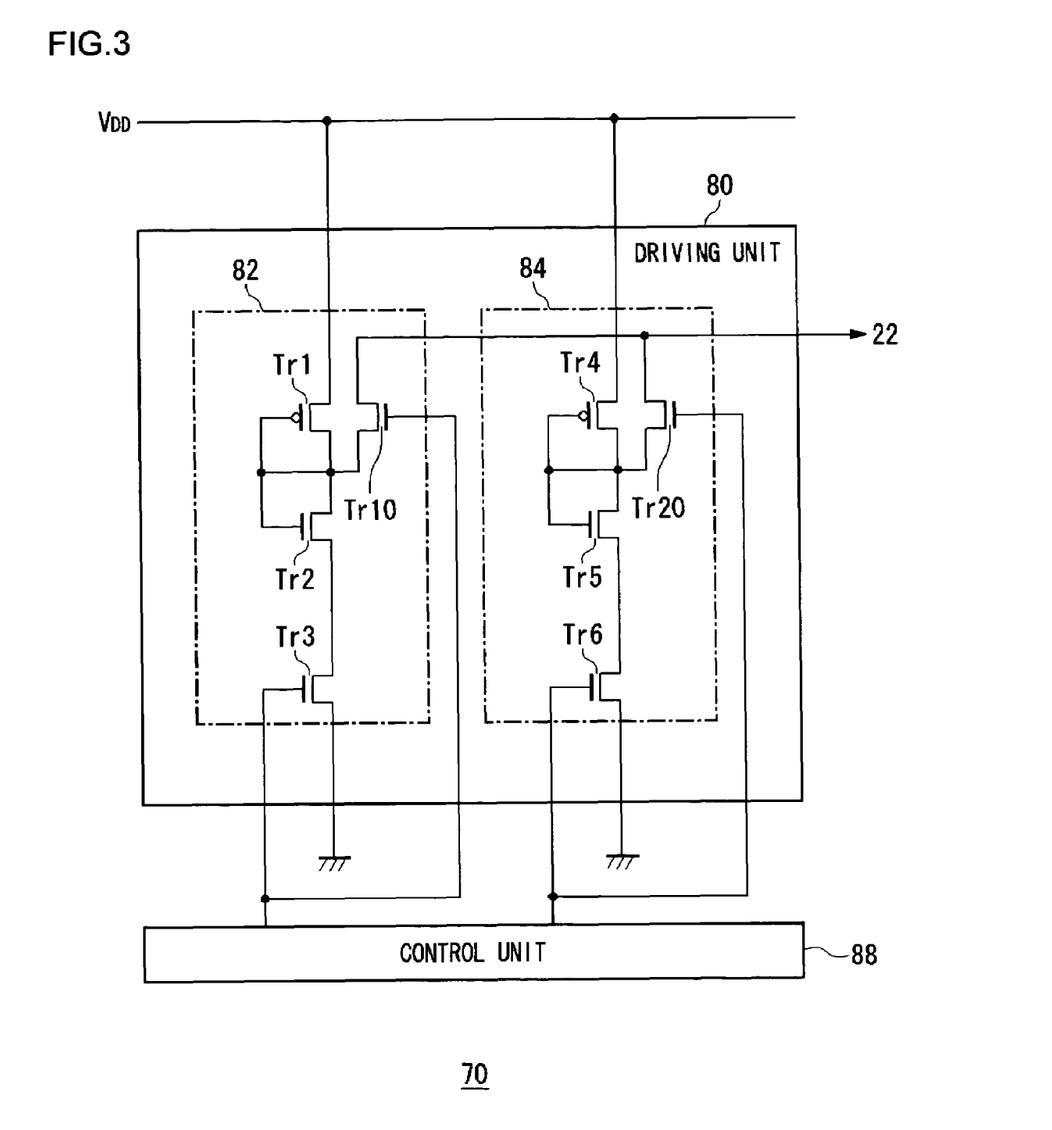
FIG. 3 is a diagram showing the configuration of a first bias voltage generating circuit.

A first bias voltage generating circuit 70, a second bias voltage generating circuit 72, a third bias voltage generating circuit 74, and a fourth bias voltage generating circuit 76 are configured as shown in FIG. 3 to be seen later, and apply bias voltages to the first conversion unit 22, the second conversion unit 24, the (n-1)th conversion unit 26, and the nth conversion unit 28, respectively.

FIG. 3 shows the configuration of the first bias voltage generating circuit 70. The first bias voltage generating circuit 70 has a driving unit 80 and a control unit 88. The driving unit 80 generates the bias voltage to be applied to such loads as the first amplifier circuit 38 of the first conversion unit 22. In a period for applying the bias voltage to the loads, the control unit 88 switches the current driving capability of the driving unit 80 according to a variation in the amount of current necessary for the loads.

The driving unit 80 includes a first bias circuit 82 and a second bias circuit 84 as a plurality of bias circuits which are connected in parallel and have different current driving capabilities. The first bias circuit 82 contains a CMOS transistor composed of a first transistor Tr1 and a second transistor Tr2 which are connected in series between a power supply potential VDD and a ground potential VSS. The first bias circuit 82 also contains a third transistor Tr3 as a switching element which interrupts a feedthrough current occurring from the CMOS transistor. The first transistor Tr1 is a P-channel MOS transistor, and the second transistor Tr2 an N-channel MOS transistor. The first transistor Tr1 and the second transistor Tr2 have a common drain electrode, and are diode-connected with their respective gate electrodes and the drain electrode shorted. The common drain electrode outputs the voltage divided by the ON resistances of the first transistor Tr1 and the second transistor Tr2 as the bias voltage. The output node is provided with a first output transistor Tr10 as a switching element for output control.

The second bias circuit 84 contains a CMOS transistor composed of a fourth transistor Tr4 and a fifth transistor Tr5 which are connected in series between the power supply potential VDD and the ground potential VSS. The second bias circuit 84 also contains a sixth transistor Tr6 as a switching element which interrupts a feedthrough current occurring from the CMOS transistor. The fourth transistor Tr4 is a P-channel MOS transistor, and the fifth transistor Tr5 an N-channel MOS transistor. The fourth transistor Tr4 and the fifth transistor Tr5 also have a common drain electrode, and are diode-connected with their respective gate electrodes and the drain electrode shorted. The common drain electrode outputs the voltage divided by the ON resistances of the fourth transistor Tr4 and the fifth transistor Tr5 as the bias voltage. The output node is provided with a second output transistor Tr20 as a switching element for output control.

The output node of the bias voltage from the first bias circuit 82 is connected with the output node of the bias voltage from the second bias circuit 84, and led to the first conversion unit 22.

The first bias circuit 82 and the second bias circuit 84 have different current driving capabilities, but output the same bias voltage. More specifically, the ratio between the device sizes of the first transistor Tr1 and the second transistor Tr2 in the first bias circuit 82 is configured the same as the ratio between the device sizes of the fourth transistor Tr4 and the fifth transistor Tr5 in the second bias circuit 84. Such size ratios are maintained while the first transistor Tr1 and the second transistor Tr2, or the fourth transistor Tr4 and the fifth transistor Tr5, are increased in size for the sake of different current driving capabilities. In general, the higher the feedthrough current, the higher the current driving capability.

The control unit 88 applies control signals to the respective gate electrodes of the third transistor Tr3, the sixth transistor Tr6, the first output transistor Tr10, and the second output transistor Tr20 for on/off control. More specifically, the first bias circuit 82 is switched between an operating state and a non-operating state through the on/off control of the control unit 88 on the third transistor Tr3 and the first output transistor Tr10. Similarly, the second bias circuit 84 is switched between an operating state and a non-operating state through the on/off control of the control unit 88 on the sixth transistor Tr6 and the second output transistor Tr20.

The control unit 88 switches the current driving capability of the entire driving unit 80 by controlling the number of circuits to operate out of the first bias circuit 82 and the second bias circuit 84. For example, in a period when the first conversion unit 22 requires a relatively high current, both the first bias circuit 82 and the second bias circuit 84 are operated. In a period when a relatively low current is sufficient, either one of the first bias circuit 82 and the second bias circuit 84 is operated. The current driving capabilities of the first bias circuit 82 and the second bias circuit 84, and the control timing of the control unit 88 on the third transistor Tr3, the sixth transistor Tr6, the first output transistor Tr10, and the second output transistor Tr20 are designed in accordance with the variation in the amount of current required in the first conversion unit 22 to which the bias voltage is applied.

Figure 4:
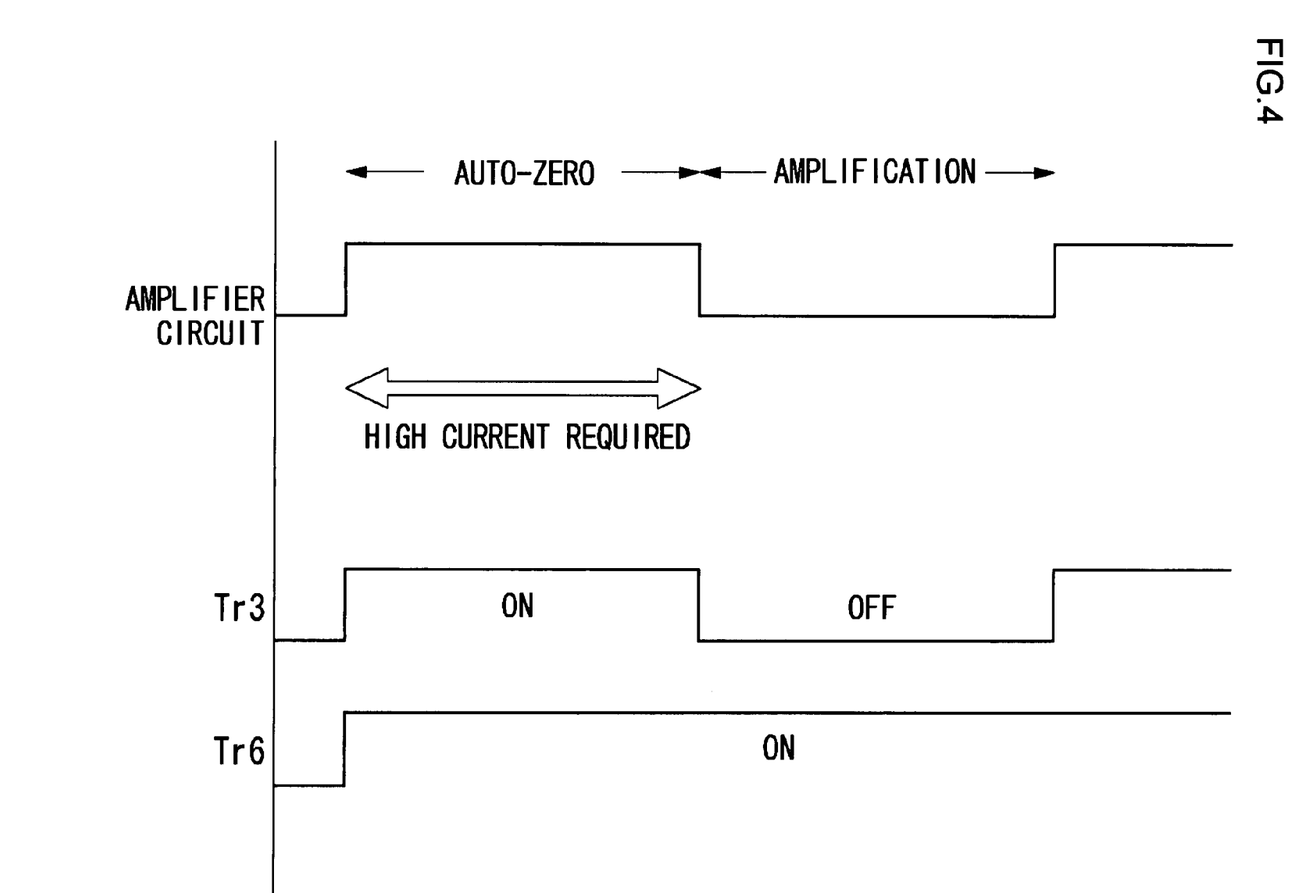
FIG. 4 is a time chart showing the relationship between a change of operation of a first conversion unit and the control of a control unit according to the first embodiment.

FIG. 4 is a time chart showing the relationship between a change of operation of the first conversion unit 22 and the control of the control unit 88 according to the first embodiment. Starting from the top, the chart shows the operation mode of the first amplifier circuit 38 included in the first conversion unit 22, the on/off timing of the third transistor Tr3, and the on/off timing of the sixth transistor Tr6. Hereinafter, the on/off timing of the third transistor Tr3 shall also represent the on/off timing of the first output transistor Tr10, and the on/off timing of the sixth transistor Tr6 the on/off timing of the second output transistor Tr20. The first amplifier circuit 38 repeats an auto-zero operation and an amplification operation alternately. In the present embodiment, a relatively high current is required in the period of the auto-zero operation, and a relatively low current is sufficient in the period of the amplification operation. On this account, the control unit 88 turns on both the third transistor Tr3 and the sixth transistor Tr6 in the period of the auto-zero operation. In the period of the amplification operation, the control unit 88 turns off the third transistor Tr3 and keeps the sixth transistor Tr6 alone turned on. This allows a fine adjustment to the power consumption of the circuit which applies the bias voltage.

The current driving capability of the second bias circuit 84 can be designed based on the amount of current required by the first conversion unit 22 in the period of the amplification operation of the first amplifier circuit 38. The current driving capability of the first bias circuit 82 can be designed based on the amount of current required by the first conversion unit 22 in the period of the auto-zero operation of the first amplifier circuit 38 and the current driving capability of the second bias circuit 84. Incidentally, the period when the third transistor Tr3 or the sixth transistor Tr6 is turned off is relatively short one included in a period when the first conversion unit 22 is in an active state. Thus, in contrast to the case where the transistors are turned off during a standby period, leak currents have only a limited impact and thus require none of such additional parts as a capacitor. In other words, it is possible to avoid an increase in circuit area while reducing the power consumption of the circuits which apply the bias voltages.

SECOND EMBODIMENT

Bias voltage generating circuits of the present embodiment differ from those of the first embodiment in the control timing of the control units on the first bias circuits and the second bias circuits. The rest of the configuration is the same as in the first embodiment.

Figure 5:
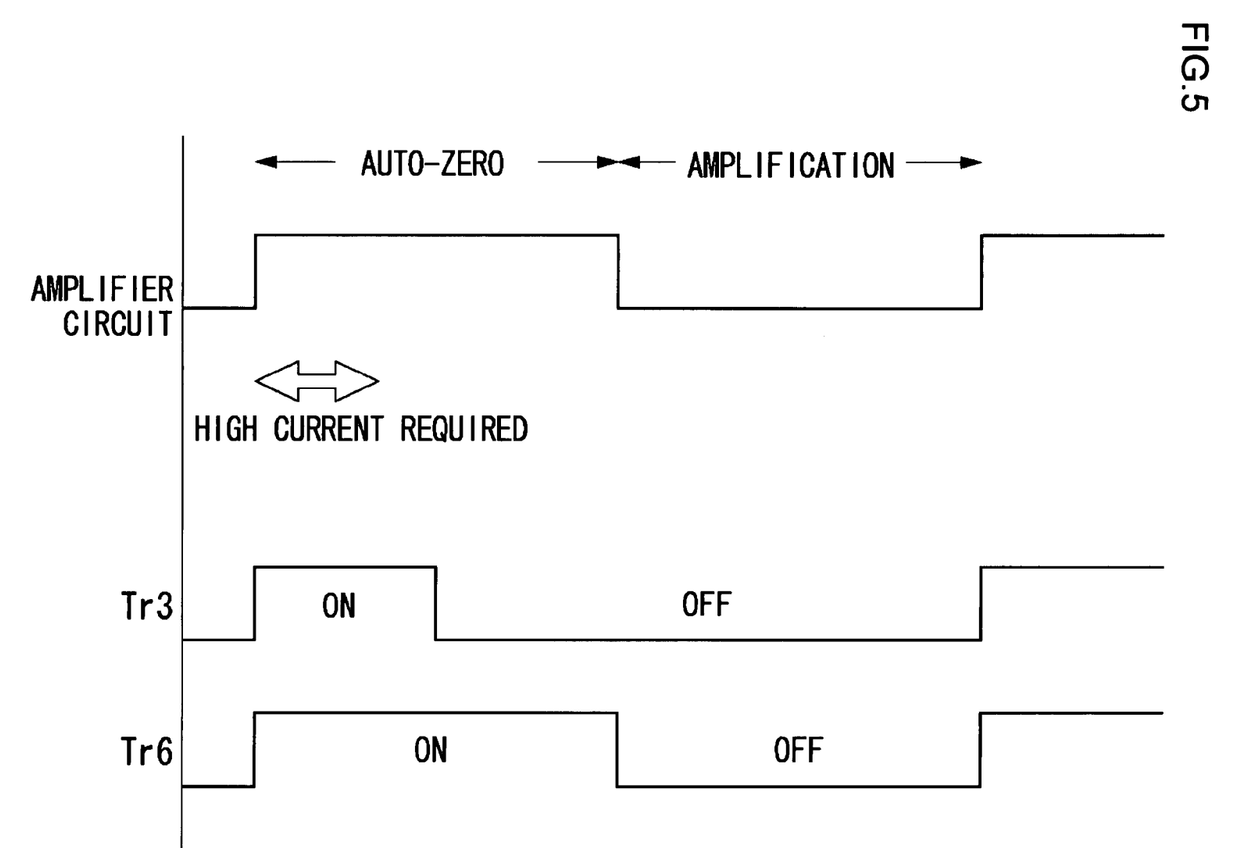
FIG. 5 is a time chart showing the relationship between a change of operation of the first conversion unit and the control of the control unit according to a second embodiment.

FIG. 5 is a time chart showing the relationship between a change of operation of the first conversion unit 22 and the control of the control unit 88 according to the second embodiment. In the present embodiment, a relatively high current is required immediately after the start of an auto-zero operation in particular, out of the period of the auto-zero operation. In the rest of the period of the auto-zero operation, a relatively low current is sufficient. On this account, the control unit 88 turns on both the third transistor Tr3 and the sixth transistor Tr6 in the period immediately after the start of the auto-zero operation. In the rest of the period of the auto-zero operation, the control unit 88 turns off the third transistor Tr3 and keeps the sixth transistor Tr6 alone turned on. Moreover, even the sixth transistor Tr6 is turned off in the period of the amplification operation. Consequently, the current driving capability of the second bias circuit 84 can be designed based on the amount of current required by the first conversion unit 22 in the period of the auto-zero operation of the first amplifier circuit 38 except immediately after the start of the auto-zero operation. The current driving capability of the first bias circuit 82 can be designed based on the amount of current required by the first conversion unit 22 immediately after the start of the auto-zero operation of the first amplifier circuit 38 and the current driving capability of the second bias circuit 84.

THIRD EMBODIMENT

Bias voltage generating circuits of the present embodiment differ from those of the first and second embodiments in that all the plurality of bias circuits constituting each driving unit have the same current driving capability. The rest of the configuration is the same as in the first or second embodiment.

Figure 6:
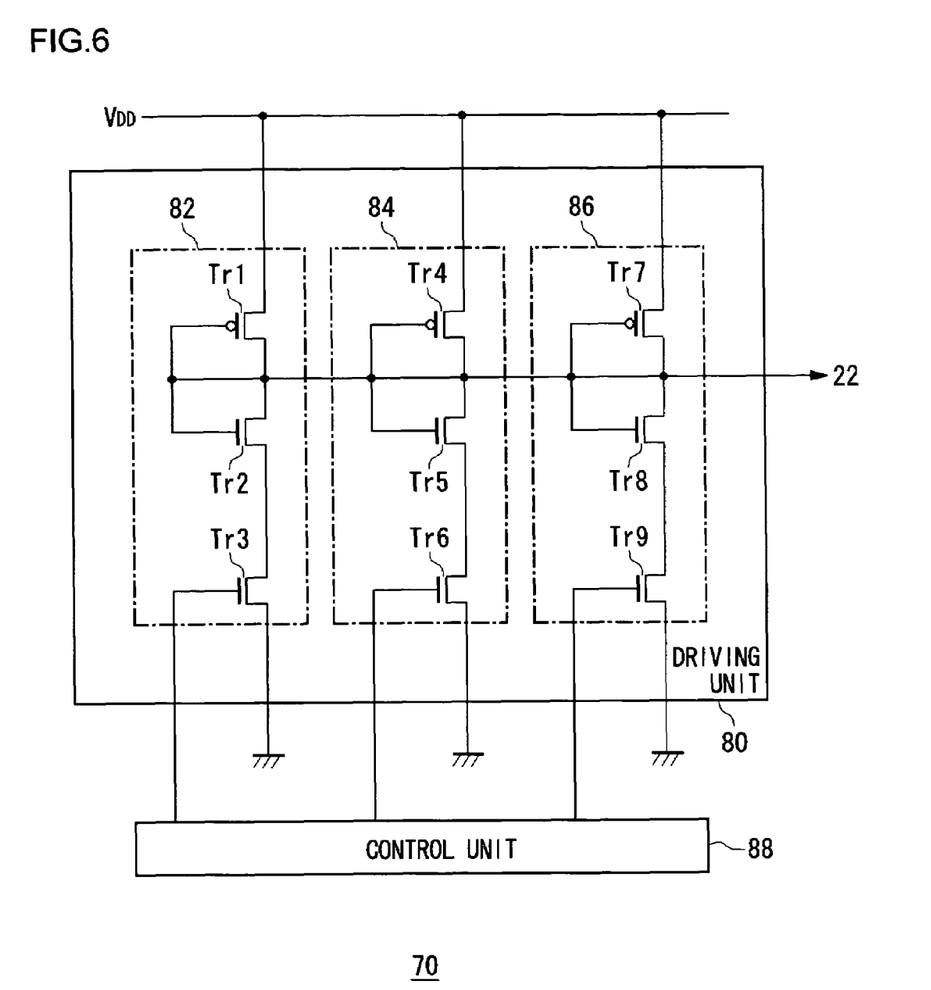
FIG. 6 is a diagram showing the configuration of a first bias voltage generating circuit according to a third embodiment.

FIG. 6 shows the configuration of a first bias voltage generating circuit 70. The bias voltage generating circuit 70 has a driving unit 80 which includes a first bias circuit 82, a second bias circuit 84, and a third bias circuit 86. These bias circuits have the same current driving capability. More specifically, first and second transistors Tr1 and Tr2 constituting the first bias circuit 82, fourth and fifth transistors Tr4 and Tr5 constituting the second bias circuit 84, and seventh and eighth transistors Tr7 and Tr8 constituting the third bias circuit 86 all have the same element sizes and size ratios.

The control unit 88 exercises on/off control on the operations of the first bias circuit 82, the second bias circuit 84, and the third bias circuit 86 by sending control signals to a third transistor Tr3, a sixth transistor Tr6, and a ninth transistor Tr9, respectively. As in the first and second embodiments, the number of circuits to operate out of the first bias circuit 82, the second bias circuit 84, and the third bias circuit 86, and the on/off timing of the same can be designed in accordance with variations in the amount of current required by the first conversion unit 22.

Incidentally, even in the first embodiment, the first bias circuit 82 and the second bias circuit 84 output the same bias voltage in principle since they are composed of transistors of the same size ratios. Nevertheless, the differences in size itself can make a slight difference in the characteristics of the transistors, possibly causing a slight deviation between the output bias voltages. In the present embodiment, not only the size ratios but also the sizes themselves are made identical. Variations of the bias voltages ascribable to characteristic variations can thus be reduced with higher reliability.

FOURTH EMBODIMENT

Bias voltage generating circuits of the present embodiment differ from those of the first to third embodiments in that they apply bias voltages to a plurality of stages of conversion units in a multistage pipelined AD conversion circuit with respective different current driving capabilities. In FIG. 2, the first conversion unit 22 at the initial stage requires 10 bits of precision while the second conversion unit 24 at the second stage requires only 10−4+1=7 bits of precision. The initial stage differs from the second and subsequent stages in bit precision, requiring different analog precisions. Consequently, the first conversion unit 22 requires a relatively high current while each of the second conversion unit 24 to the nth conversion unit 28 at the second and subsequent stages requires only a relatively low current. The sizes of the devices in the bias circuits and the control timing of the control unit 88 are designed accordingly so that the current driving capability of the first bias voltage generating circuit 70 is different from the current driving capabilities of the second bias voltage generating circuit 72 to the fourth bias voltage generating circuit 76.

FIFTH EMBODIMENT

Bias voltage generating circuits of the present embodiment differ from those of the other embodiments in that the bias circuits included in their drive units are configured as Wilson type current mirrors.

Figure 7:
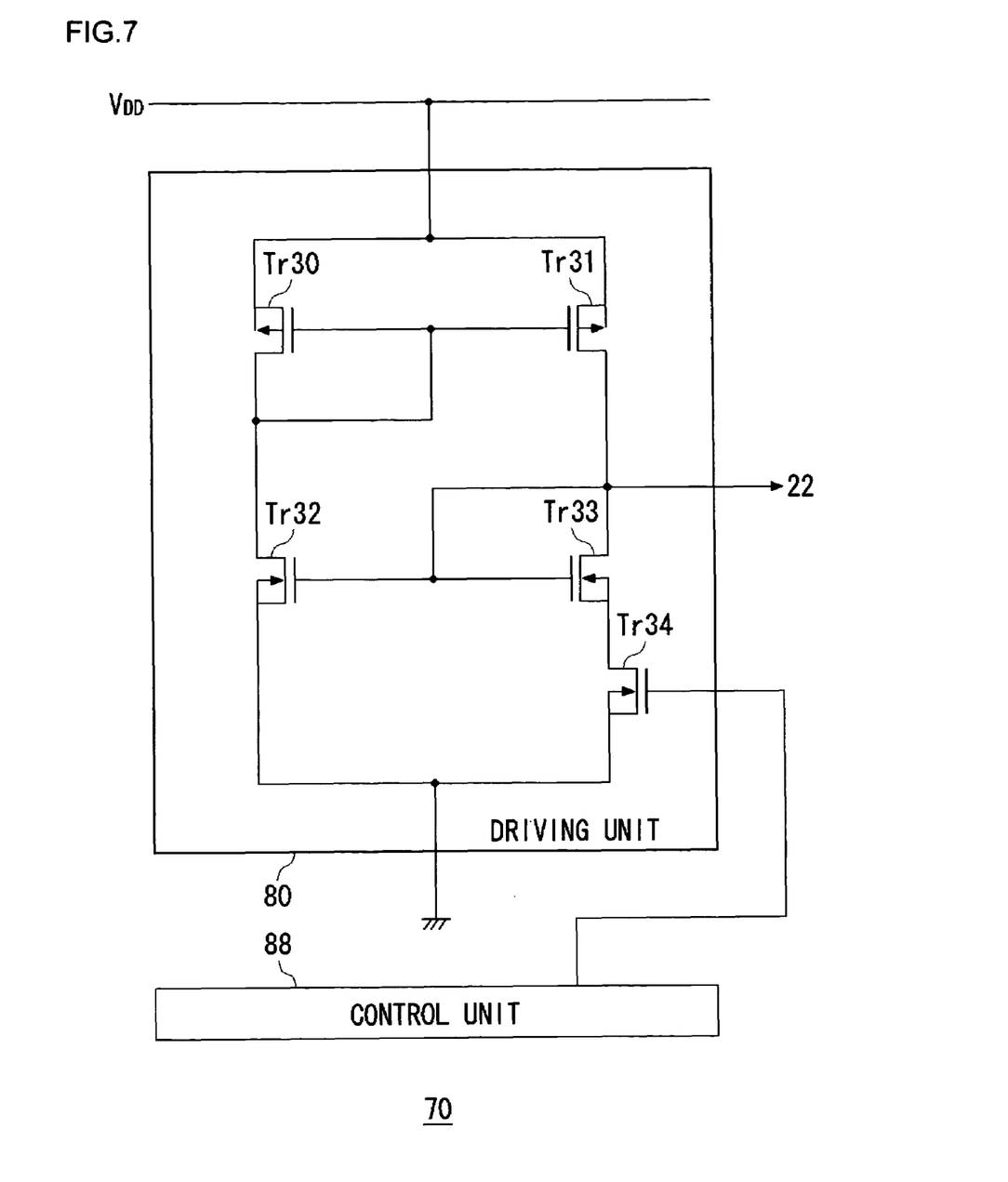
FIG. 7 is a diagram showing the configuration of a first bias voltage generating circuit according to a fifth embodiment.

FIG. 7 shows the configuration of a first bias voltage generating circuit according to the fifth embodiment. The driving unit 80 includes a tenth transistor Tr30, an eleventh transistor Tr31, a twelfth transistor Tr32, a thirteenth transistor Tr33, and a fourteenth transistor Tr34. The tenth transistor Tr30 and the eleventh transistor Tr31 are p-channel MOS transistors having generally the same size ratios, and form a current mirror. The tenth transistor Tr30 and the eleventh transistor Tr31 have a common source electrode which is connected to the power supply potential VDD, and a common gate electrode which is shorted to the drain electrode of the tenth transistor Tr30.

The twelfth transistor Tr32 and the thirteenth transistor Tr33 are n-channel MOS transistors having different size ratios, and form a current mirror. The drain electrode of the twelfth transistor Tr32 is connected to the drain electrode of the tenth transistor Tr30. The drain electrode of the thirteenth transistor Tr33 is connected to the drain electrode of the eleventh transistor Tr31. The common gate electrode is shorted to the drain electrode of the thirteenth transistor Tr33. The source electrode of the twelfth transistor Tr32 is connected to the ground potential, and the source electrode of the thirteenth transistor Tr33 is connected to the drain electrode of the fourteenth transistor Tr34. The source electrode of the fourteenth transistor Tr34 is connected to the ground potential.

The fourteenth transistor Tr34 is controlled on/off by the control unit 88. When the fourteenth transistor Tr34 is off, the tenth transistor Tr30 and the eleventh transistor Tr31 turn on, and the twelfth transistor Tr32 and the thirteenth transistor Tr33 turn off. A first bias voltage having generally the same value as the power supply potential VDD is thus output to the first conversion unit 22. When the fourteenth transistor Tr34 is on, the tenth transistor Tr30, the eleventh transistor Tr31, the twelfth transistor Tr32, and the thirteenth transistor Tr33 are all turned on. A second bias voltage having a value corresponding to the difference between the size ratios of the twelfth transistor Tr32 and the thirteenth transistor Tr33 is thus output to the first conversion unit 22.

As above, even in the present embodiment, the control unit 88 can switch the current driving capability of the driving unit 80 according to a variation in the amount of current necessary for the load, or the first conversion unit 22, during a period for applying a bias voltage to the first conversion unit 22. That is, the control unit 88 can switch the output of the driving unit 88 between the first and second bias voltages which are different from each other.

SIXTH EMBODIMENT

Bias voltage generating circuits of the present embodiment differ from those of the fifth embodiment which use Wilson type current mirrors. The difference consists in that the bias circuits included in the driving units are configured as typical current mirrors.

Figure 8:
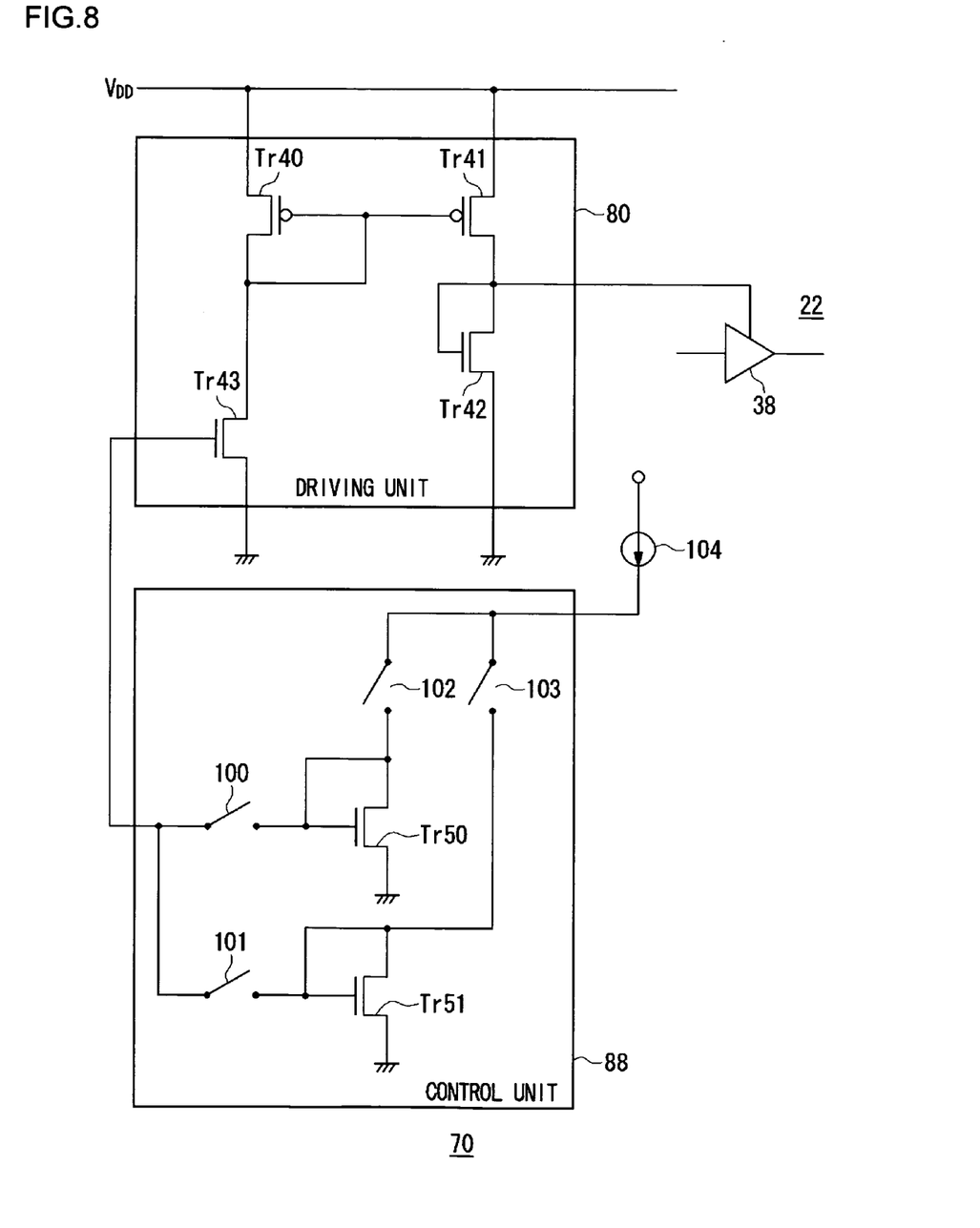
FIG. 8 is a diagram showing the configuration of a first bias voltage generating circuit according to a sixth embodiment.

FIG. 8 shows the configuration of a first bias voltage generating circuit according to the sixth embodiment. The driving unit 80 includes a fifteenth transistor Tr40, a sixteenth transistor Tr41, a seventeenth transistor Tr42, and an eighteenth transistor Tr43. The fifteenth transistor Tr40 and the sixteenth transistor Tr41 are p-channel MOS transistors, and form a current mirror. The source electrodes of both the fifteenth transistor Tr40 and the sixteenth transistor Tr41 are connected to the power supply potential VDD. The common gate electrode is shorted to the drain electrode of the fifteenth transistor Tr40.

The seventeenth transistor Tr42 is an n-channel MOS transistor. The drain electrode and the gate electrode thereof are shorted, and the drain electrode is connected with the drain electrode of the sixteenth transistor T41. The source electrode of the seventeenth transistor Tr42 is connected to the ground potential. The drain electrodes of the sixteenth transistor Tr41 and the seventeenth transistor Tr42 outputs bias voltages corresponding to the respective size ratios of the fifteenth transistor Tr40 and the sixteenth transistor Tr41 to the first amplifier circuit 38.

The eighteenth transistor Tr43 is an n-channel MOS transistor. The drain electrode thereof is connected with the drain electrode of the fifteenth transistor Tr40. The source electrode is connected to the ground potential. The control unit 88 applies two values of voltage to the gate electrode of the eighteenth transistor Tr43 as control signals.

The control unit 88 includes a nineteenth transistor Tr50, a twentieth transistor Tr51, a first switch 100, a second switch 101, a third switch 102, and a fourth switch 103. When outputting a first voltage to the driving unit 80, the control unit 88 turns on the first switch 100 and the third switch 102, and turns off the second switch 101 and the fourth switch 103. When outputting a second voltage to the driving unit 80, the control unit 88 turns off the first switch 100 and the third switch 102, and turns on the second switch 101 and the fourth switch 103. The nineteenth transistor Tr50 and the twentieth transistor Tr51 have different size ratios, and apply the first voltage and the second voltage of different values to the driving unit 80.

The eighteenth transistor Tr43 drives currents of different values between when the first voltage is applied to its gate electrode and when the second voltage is applied thereto. This switches the value of the current flowing through the eighteenth transistor Tr43 according to the control of the control unit 88, also switching the value of the bias voltage output from the driving unit 80.

As above, even in the present embodiment, the control unit 88 can switch the current driving capability of the driving unit 80 according to a variation in the amount of current necessary for the load, or the first conversion unit 22, during a period in which a bias voltage is applied to the first conversion unit 22. That is, the control unit 88 can switch the output of the driving unit 88 between the first and second bias voltages which are different from each other.

While the present embodiment has illustrated the case where the bias voltages are applied to the first amplifier circuit 38, the bias voltages may be applied to other comparators. For example, each of the comparators included in the first AD conversion circuit 32, the second AD conversion circuit 42, the (n-1)th AD conversion circuit 52, and the nth AD conversion circuit 60 may be subjected to the bias voltages. The second amplifier circuit 48 or the (n-1)th amplifier circuit 58 may be subjected to the bias voltages.

Up to this point, the present invention has been described in conjunction with the embodiments. These embodiments are given solely by way of illustration. It will be understood by those skilled in the art that various modified examples may be made of combinations of the foregoing components and processes, and all such modified examples are also intended to fall within the scope of the present invention. The following provides some of the modified examples.

FIG. 4 of the first embodiment shows that the control unit 88 turns off the third transistor Tr3 at the timing when the auto-zero operation switches to the amplification operation. In a modified example, the control unit 88 may control the third transistor Tr3 to turn off at any arbitrary timing after the instant when the auto-zero operation switches to the amplification operation and before the start of the next auto-zero operation.

FIG. 5 of the second embodiment shows that the control unit 88 turns off the third transistor Tr3 at the end of the period immediately after the start of the auto-zero operation when a relatively high current is required. In a modified example, the control unit 88 may control the third transistor Tr3 to turn off at any arbitrary timing between the end of the period immediately after the start of the auto-zero operation when a relatively high current is required, and the time of switching to the amplification operation. FIG. 5 also shows that the control unit 88 turns off the sixth transistor Tr6 at the time of switching to the amplification operation. In a modified example, the control unit 88 may control the sixth transistor Tr6 to turn off at any arbitrary timing between the end of the period immediately after the start of the auto-zero operation when a relatively high current is required, and before the start of the next auto-zero operation starts.

In the first to third embodiments, the driving unit 80 is composed of two to three bias circuits. In a modified example, a greater number of bias circuits may be used. Bias circuits having the same current driving capability and ones having different current driving capabilities may be used together.

In the fourth embodiment, differences in current driving capability are described with the first conversion unit 22 at the initial stage distinguished from the second to nth conversion units 24-28 at the second and subsequent stages. In a modified example where the amounts of current required at the second and subsequent stages decrease gradually, the second bias voltage generating circuit 72 to the fourth bias voltage generating circuit 76 may be configured to show gradual decreases in current driving capability accordingly.

In FIG. 2, the first conversion unit 22, the second conversion unit 24, and the (n-1)th conversion unit 26 are provided with a single amplifier circuit each. In a modified example, the first conversion unit 22 at the initial stage may be provided with an additional amplifier circuit such as a sample hold circuit. In this case, the bias circuits constituting the first bias voltage generating circuit 70 and the control timing of the control unit 88 are designed in consideration of the amount of current necessary for the operation of the amplifier circuit. Similarly, the bias voltage to be applied to the AGC 14 shown in FIG. 1 may also be generated by a bias voltage generating circuit similar to those of the embodiments.

FIG. 6 of the third embodiment shows an example of configuration in which no switching element for output control is arranged on the nodes of the bias voltages output from the respective bias circuits. In a modified example, the output nodes may be provided with switching elements for output control as in FIG. 3 of the first embodiment.

What is claimed is:
1. A bias voltage generating circuit comprising:
a driving unit which generates a bias voltage to be applied to a predetermined load, and
a control unit which switches a current driving capability of the driving unit according to a variation in an amount of current required for the load in a period for applying the bias voltage to the load, wherein
the driving unit includes a plurality of bias circuits which are connected in parallel and have different current driving capabilities,
the control unit switches the current driving capability by controlling the number of circuits to operate out of the plurality of bias circuits,
the plurality of bias circuits output the same bias voltage, and
each of the plurality of bias circuits includes:
a CMOS transistor pair composed of a PMOS transistor and an NMOS transistor which are connected in series between a power supply potential and a ground potential and have a common drain connected to their respective gates, the drain outputting the bias voltage;
a first switching element which interrupts a feedthrough current occurring from the CMOS transistor pair; and
a second switching element which controls output of the bias voltage from the CMOS transistor pair.

2. The bias voltage generating circuit according to claim 1, wherein
the predetermined load is an amplifier which is included in an AD converter.

3. The bias voltage generating circuit according to claim 1, wherein
the control unit controls the number of circuits to operate by sending control signals to the respective switching elements included in the plurality of bias circuits.

4. A bias voltage generating circuit comprising:
a driving unit which generates a bias voltage to be applied to a predetermined load, and
a control unit which switches a current driving capability of the driving unit according to a variation in an amount of current required for the load in a period for applying the bias voltage to the load, wherein
the driving unit includes a plurality of bias circuits which are connected in parallel and have the same current driving capability,
the control unit switches the current driving capability by controlling the number of circuits to operate out of the plurality of bias circuits, and
each of the plurality of bias circuits includes:
a CMOS transistor pair composed of a PMOS transistor and an NMOS transistor which are connected in series between a power supply potential and a ground potential and have a common drain connected to their respective gates, the drain outputting the bias voltage;
a first switching element which interrupts a feedthrough current occurring from the CMOS transistor pair; and
a second switching element which controls output of the bias voltage from the CMOS transistor pair.

5. The bias voltage generating circuit according to claim 4, wherein
the control unit controls the number of circuits to operate by sending control signals to the respective switching elements included in the plurality of bias circuits.

6. A bias voltage generating circuit comprising;
a driving unit which generates a bias voltage to be applied to a predetermined load; and
a control unit which switches a current driving capability of the driving unit according to a variation in an amount of current required for the load in a period for applying the bias voltage to the load,
wherein the driving unit includes a bias circuit configured for outputting a first bias voltage and a second bias voltage which are different from each other, selectively; and
the control unit switches the output of the driving unit between the first bias voltage and the second bias voltage according to a variation in the amount of current necessary for the load,
wherein the bias circuit is a Wilson type current mirror circuit which includes at least a pair of n-channel transistors having different width/length ratios, a pair of p-channel transistors having generally the same width/length ratios, and a switching element which switches the output between the first bias voltage and the second bias voltage.

7. An amplifier circuit comprising:
an amplifier unit which repeats an auto-zero operation and an amplification operation alternately;
a driving unit which supplies the amplifier unit with a bias voltage; and
a control unit which switches the current driving capability of the driving unit according to a variation in an amount of current required between the auto-zero operation and the amplification operation of the amplifier unit, wherein
the driving unit includes a plurality of bias circuits which are connected in parallel and have different current driving capabilities,
the control unit switches the current driving capability by controlling the number of circuits to operate out of the plurality of bias circuits, and
each of the plurality of bias circuits includes:
a CMOS transistor pair composed of a PMOS transistor and an NMOS transistor which are connected in series between a power supply potential and a ground potential and have a common drain connected to their respective gates, the drain outputting the bias voltage;
a first switching element which interrupts a feedthrough current occurring from the CMOS transistor pair; and
a second switching element which controls output of the bias voltage from the CMOS transistor pair.

8. The amplifier circuit according to claim 7, wherein
the control unit controls the number of circuits to operate by sending control signals to the respective switching elements included in the plurality of bias circuits.

9. An amplifier circuit comprising:
an amplifier unit which repeats an auto-zero operation and an amplification operation alternately;
a driving unit which supplies the amplifier unit with a bias voltage; and
a control unit which switches the current driving capability of the driving unit according to a variation in an amount of current required between the auto-zero operation and the amplification operation of the amplifier unit, wherein
the driving unit includes a plurality of bias circuits which are connected in parallel and have the same current driving capability,
the control unit switches the current driving capability by controlling the number of circuits to operate out of the plurality of bias circuits, and
each of the plurality of bias circuits includes:
a CMOS transistor pair composed of a PMOS transistor and an NMOS transistor which are connected in series between a power supply potential and a ground potential and have a common drain connected to their respective gates, the drain outputting the bias voltage;

a first switching element which interrupts a feedthrough current occurring from the CMOS transistor pair; and a second switching element which controls output of the bias voltage from the CMOS transistor pair.

10. The amplifier circuit according to claim 9, wherein the control unit controls the number of circuits to operate by sending control signals to the respective switching elements included in the plurality of bias circuits.

11. An amplifier circuit comprising:

an amplifier unit which repeats an auto-zero operation and an amplification operation alternately;

a driving unit which supplies the amplifier unit with a bias voltage; and a control unit which switches the current driving capability of the driving unit according to a variation in an amount of current required between the auto-zero operation and the amplification operation of the amplifier unit, wherein the driving unit includes a bias circuit configured for outputting a first bias voltage and a second bias voltage which are different from each other, selectively; and the control unit switches the output of the driving unit between the first bias voltage and the second bias voltage according to a variation in the amount of current necessary for the load, wherein the bias circuit is a Wilson type current mirror circuit which includes at least a pair of n-channel transistors having different width/length ratios, a pair of p-channel transistors having generally the same width/length ratios, and a switching element which switches the output between the first bias voltage and the second bias voltage.

12. A pipelined AD converter having a plurality of stages of conversion units which generate several bits of digital values of descending order from an input analog voltage, respectively, the AD converter comprising:

an amplifier unit which repeats an auto-zero operation and an amplification operation alternately;

a driving unit which supplies the amplifier unit with a bias voltage; and a control unit which switches a current driving power of the driving unit according to a variation in the amount of current required between the auto-zero operation and the amplification operation of the amplifier unit, the control unit controlling the current driving capability so as to drive at least any one of the plurality of stages of conversion units with a relatively high current and drive the other conversion units with a lower current.

13. The pipelined AD converter according to claim 12, wherein the control unit controls the current driving capability so as to drive the first conversion unit at the initial stage with a relatively high current and drive the second and subsequent conversion units with a lower current.

* * * * *